United States Patent
Arakawa

[19]

[11] Patent Number: 6,133,808
[45] Date of Patent: Oct. 17, 2000

[54] DIELECTRIC FILTER HAVING INPUT/OUTPUT ELECTRODES CONNECTED TO ELECTRODES ON A SUBSTRATE, AND DIELECTRIC DUPLEXER INCORPORATING THE DIELECTRIC FILTER

[75] Inventor: Shigeji Arakawa, Kanazawa, Japan

[73] Assignee: Murata Manufacturing Co., Ltd., Japan

[21] Appl. No.: 09/023,562

[22] Filed: Feb. 13, 1998

[30] Foreign Application Priority Data

May 14, 1997 [JP] Japan ................................. 9-030878
Dec. 17, 1997 [JP] Japan ................................. 9-348293

[51] Int. Cl.$^7$ .............................. H01P 1/213; H01P 1/20
[52] U.S. Cl. ............................ 333/134; 33/135; 33/208; 33/212
[58] Field of Search .................... 33/202, 208, 212, 33/246, 134, 135, 219.1, 209, 210

[56] References Cited

U.S. PATENT DOCUMENTS

| | | | |
|---|---|---|---|
| 4,725,798 | 2/1988 | Igarashi | 333/212 |
| 4,963,844 | 10/1990 | Konishi et al. | 333/208 |
| 5,196,813 | 3/1993 | Nakakubo | 333/206 |
| 5,382,931 | 1/1995 | Pilot ret al. | 333/208 |
| 6,002,306 | 12/1999 | Arakawa | 333/134 |
| 6,002,307 | 12/1999 | Arakawa | 333/202 X |
| 6,020,800 | 2/2000 | Arakawa et al. | 333/208 |

FOREIGN PATENT DOCUMENTS

| | | | |
|---|---|---|---|
| 64-53605 | 3/1989 | Japan | 333/202 |
| 3-77402 | 4/1991 | Japan | 333/202 |
| 3-216001 | 9/1991 | Japan | 333/208 |
| 3-270501 | 12/1991 | Japan | 333/202 |
| 4-287502 | 10/1992 | Japan | 333/202 |
| 5-129814 | 5/1993 | Japan | 333/202 |
| 2276041 | 9/1994 | United Kingdom . | |

OTHER PUBLICATIONS

"Spurious Free D.R. Te Mode Band Pass Filter" Abdelmonem A. et al., IEEE MTT–S International Microwave Symposium Digest, San Diego, May 23–27, 1994, vol. 2, May 23, 1994, Kuno H. J. & Wen C.P. (Editors), pp. 735, right–hand column, line 10–line 17, figure 1.

"Novel Dielectric Waveguide Components–Microwave Applications of New Ceramic Materials" Yoshihiro Konishi, Proceedings of the IEEE, vol. 97, No. 6, Jun. 1, 1991, pp. 726–740, XP000262350, figures 11, 13 and 31.

Patent Abstracts of Japan, vol. 11, No. 195 (E–518), Jun. 23, 1987 & JP 62 023204 A (Oki Electric Ind. Co. Ltd.), Jan. 31, 1987, abstract.

European Search Report dated May 25, 1998.

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

The invention provides a dielectric filter and a dielectric duplexer each having a high degree of freedom in terms of the direction and position of a lead electrode and having a high mutual bonding strength among resonators against bending stress. At both ends of an insulating substrate, lead electrodes are formed. TE-mode dielectric resonators are connected in series with electrically conductive adhesive such as solder and are secured to the substrate again with electrically conductive adhesive. A respective input and output electrode of each of the resonators is connected to a corresponding lead electrode on the substrate with electrically conductive adhesive. The lead electrodes can be routed in any way on the surface of the substrate, and thereby the lead directions and the lead positions can freely be changed.

11 Claims, 13 Drawing Sheets

DIELECTRIC FILTER HAVING INPUT/OUTPUT ELECTRODES CONNECTED TO ELECTRODES ON A SUBSTRATE, AND DIELECTRIC DUPLEXER INCORPORATING THE DIELECTRIC FILTER

BACKGROUND OF THE INVENTION

1. Field of the Invention

The present invention relates to dielectric filters and dielectric duplexers, and more particularly, to a dielectric filter and a dielectric duplexer for use in a communication unit in the microwave band or the millimeter-wave band.

2. Related Art of the Invention

To provide a dielectric filter which does not have a large transmission loss even in a frequency band of 3 GHz or higher, the dielectric filter shown in FIG. 22 was proposed in Japanese laid-open patent publication No. 4-287502. In the dielectric filter 80 shown in FIG. 22, three $TE_{10}$-mode resonators 81a, 81b, and 81c are connected in series.

As shown in FIG. 23, two resonators 81a and 81b disposed at both ends of the dielectric filer 80 are provided with outer conductors 83a and 83b formed on the surfaces of dielectric blocks 87a and 87b so as to substantially cover the dielectric blocks 87a and 87b. At ends of the resonators 81a and 81b, input and output electrodes 82a and82b are formed. On respective connection planes at corresponding ends of the resonators 81a and 81b, the outer conductors 83a and 83b extend, except for circular coupling windows 84a and 84b.

The resonator 81c disposed at the center of the dielectric filter 80 is provided with an outer conductor 83c formed on the surface of a dielectric block 87c so as to substantially cover the dielectric block 87c. On connection planes at both ends of the resonator 81c, the outer conductor 83c extends, except for circular coupling windows 84c and 84d. These three resonators 81a to 81c are connected in series by bonding the outer conductor 83c extending to the connection planes at both sides of the resonator 81c to the outer conductors 83a and 83b extending to the connection planes of the resonators 81a and 81b with electrically conductive adhesive such as solder to form the dielectric filter 80.

L-shaped metallic lead electrodes 86a and 86b are mounted by soldering to the input and output electrodes 82a and 82b, respectively, provided at both ends of the dielectric filter 80. The dielectric filter 80 is connected to an external circuit via these lead electrodes 86a and 86b.

A dielectric filter 90 shown in FIG. 24 has also been proposed. The dielectric filter 90 has substantially the same structure as the dielectric filter 80 except that resonators 81a, 81b, and 81c are connected in series by the use of fixing metal fittings 85a and 85b. In other words, as shown in FIG. 25, gaps are provided between the resonators 81a and 81c and between the resonators 81c and 81b to allow the relative positional relationships among the resonators 81a to 81c to be easily changed. The positions of the resonators 81a to 81c are adjusted as required in order to obtain the desired electromagnetic coupling among the resonators 81a to 81c. Mutual electromagnetic coupling among the resonators 81a, 81b, and 81c can be easily adjusted in this way.

After the relative positions of the resonators 81a to 81c are adjusted, the resonators 81a and 81c are supported and connected by a fixing metal fitting 85a and the resonators 81c and 81b are supported and connected by a fixing metal fitting 85b to form the dielectric filter 90. L-shaped metallic lead electrodes 86a and 86b are mounted by soldering to the input and output electrodes 82a and 82b, respectively, provided at both ends of the dielectric filter 90.

However, since the dielectric filters 80 and 90 are connected to an external circuit via their input and output electrodes 82a and 82b and via the L-shaped metallic lead electrodes 86a and 86b, a low degree of freedom is provided in terms of the lead direction and the lead position due to restrictions on the material and shape of the lead electrodes 86a and 86b. Therefore, the degree of freedom in designing the patterns of the external circuit to be connected to these lead electrodes 86a and 86b is also low.

In addition, since the dielectric filter 80 has a structure in which the resonators 81a to 81c are bonded by electrically conductive adhesive applied to the connection planes, mutual connection strength among the resonators 81a to 81c is relatively low. Therefore, if bending stress is applied to the dielectric filter 80, a crack or peeling off may occur at the bonded sections of the resonators 81a to 81c.

SUMMARY OF THE INVENTION

Accordingly, an object of the present invention is to provide a dielectric filter and a dielectric duplexer each having a high degree of freedom in terms of the directions and positions of lead electrodes and having a high mutual connection strength among the resonators against bending stress.

According to one aspect of the present invention, a dielectric filter may comprise a substrate; a plurality of TE-mode dielectric resonators each of which comprises a respective dielectric block, a conductor and an input/output electrode provided on a surface of said respective dielectric block, said TE-mode dielectric resonators disposed on said substrate, and a lead electrode provided on said substrate and electrically connected to said input/output electrode.

In the above dielectric filter, the TE-mode dielectric resonators may be connected in series and secured to the substrate.

In the above dielectric filter, a coupling line for coupling at least two of said plurality of TE-mode dielectric resonators may be provided on said substrate.

In the above dielectric filter, the lead electrode may be associated with a lead through hole extending to both of the two major surfaces of said substrate.

In the above dielectric filter, the substrate may be a multilayer substrate formed of at least two insulating sheets laminated to each other.

The above dielectric filter may be a dielectric duplexer.

According to another aspect of the Invention a dielectric duplexer may comprise; a substrate; at least one first TE-mode dielectric resonator forming a transmission filter, comprising a first dielectric block, a first conductor and a first input/output electrode provided on a surface of said first dielectric block, said first TE-mode dielectric resonator disposed on said substrate; at least one second TE-mode dielectric resonator forming a receiving filter, comprising a second dielectric block, a second conductor and a second input/output electrode provided on a surface of said second dielectric block, said second TE-mode dielectric resonator disposed on said substrate; a transmission electrode and a receiving electrode provided on said substrate and electrically connected to said transmission filter and said receiving filter respectively; and an antenna electrode provided on said substrate and connected to both of said transmission filter and said receiving filter.

According to these and other aspect of the present invention, the lead electrode can be routed in any way on the surface of the substrate. Therefore, there are no restrictions on the direction and position of the lead electrode, and thereby the degree of freedom in designing an external circuit to be connected to the lead electrode is increased as compared with a conventional dielectric filter and dielectric duplexer. In addition, since the resonators are secured to the substrate while being connected to each other, mutual bonding of the resonators is reinforced by the mechanically strong substrate. Furthermore, the degree of freedom in designing a dielectric filter can be further improved by providing a coupling line and/or a through hole for the substrate.

PREFERRED EMBODIMENTS OF THE PRESENT INVENTION

Other features and advantages of the present invention will become apparent from the following description of the invention which refers to the accompanying drawings. In each embodiment, the same symbols are assigned to the same components or the same portions.

[First embodiment, FIG. 1 to FIG. 5]

Figure 1:
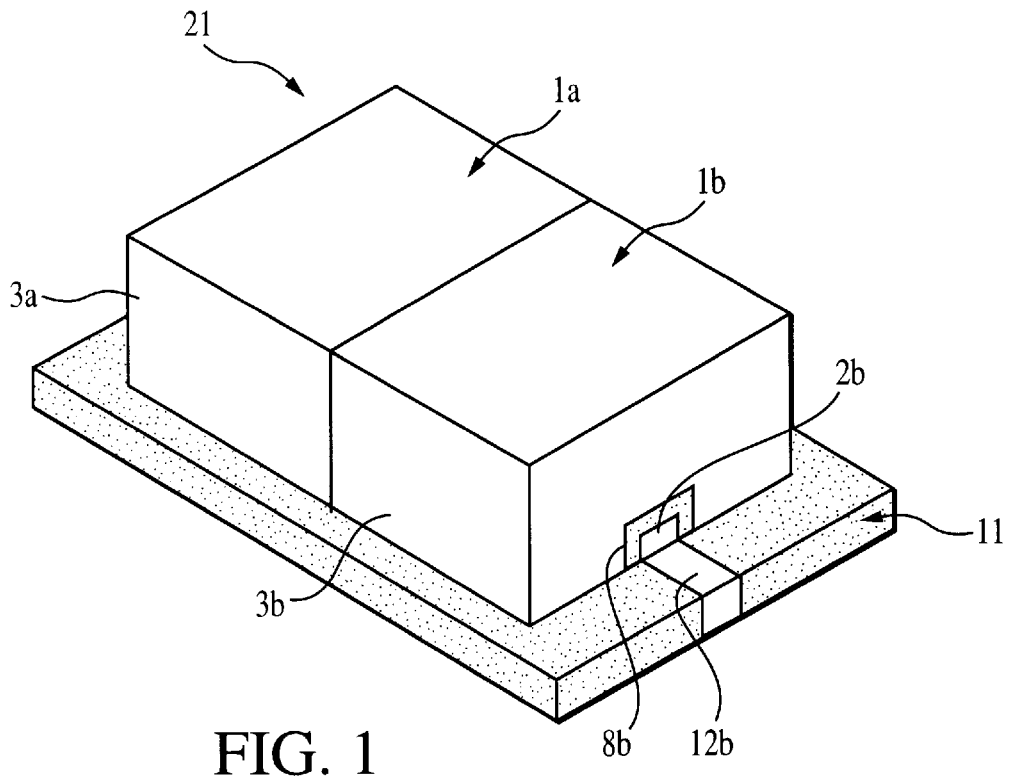
FIG. 1 is an external perspective view of a dielectric filter according to a first embodiment of the present invention.
Figure 2:
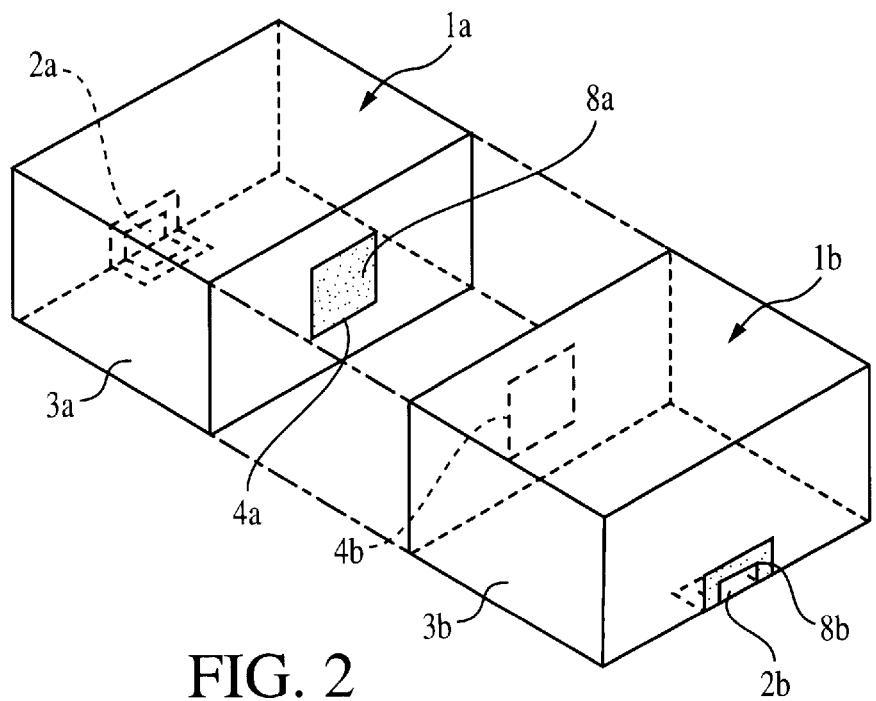
FIG. 2 is a perspective view of connected resonators used in the dielectric filter shown in FIG. 1.

As shown in FIG. 1, a dielectric filter 21 has two rectangular-parallelepiped $TE_{10}$-mode dielectric resonators 1a and 1b, and an insulating substrate 11. As shown in FIG. 2, in the $TE_{10}$-mode dielectric resonators 1a and 1b, outer conductors 3a and 3b are formed on the surfaces of dielectric blocks 8a and 8b so as to substantially cover the dielectric blocks 8a and 8b. On the connection planes of the resonators 1a and 1b, the outer conductors 3a and 3b extend, except for rectangular coupling windows 4a and 4b.

At ends of the resonators 1a and 1b, input and output electrodes 2a and 2b are formed so as not to electrically connect to the outer conductors 3a and 3b with a gap therebetween. The two resonators 1a and 1b are connected in series by bonding the outer conductors 3a and 3b extending to the connection planes, with electrically conductive adhesive such as solder. The resonators 1a and 1b are electromagnetically coupled through the coupling windows 4a and 4b.

Figure 3:
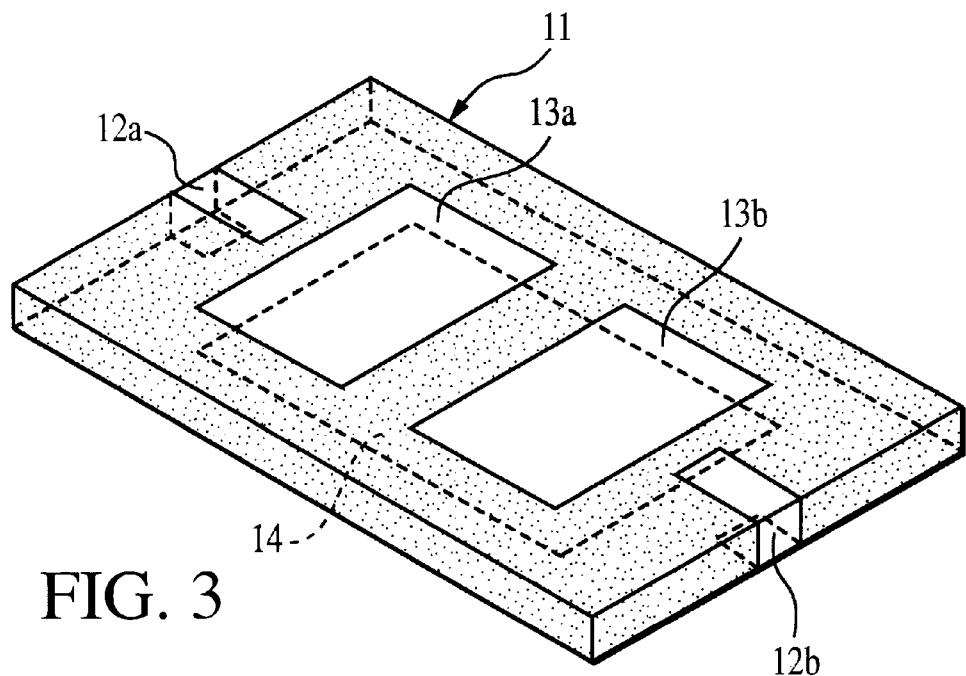
FIG. 3 is a perspective view of a substrate used in the dielectric filter shown in FIG. 1.

As shown in FIG. 3, on surfaces of the insulating substrate 11, lead electrodes 12a and 12b, electrodes 13a and 13b for connecting to the resonators, and a ground electrode 14 are formed of copper foil, gold electrodes, or a silver electrode. The insulating substrate 11 is formed of, for example, a BT resin or epoxy printed circuit board, or a ceramic board. The substrate 11 has an area large enough for mounting the connected resonators 1a and 1b.

The lead electrodes 12a and 12b are formed such that first ends are disposed at the specified positions so as to connect to the input and output electrodes 2a and 2b, and the other ends extend to the centers of the left and right sides of the substrate 11. The electrodes 13a and 13b are disposed slightly left and right of the center on the upper surface of the substrate 11 without being electrically connected to the lead electrodes 12a and 12b. The ground electrode 14 is disposed on the lower surface of the substrate 11 without being electrically connected to the lead electrodes 12a and 12b.

As shown in FIG. 1, the connected resonators 1a and 1b are secured to the substrate 11. Electrically conductive adhesive is applied to the electrodes 13a and 13b for connecting to the resonators and the lead electrodes 12a and 12b, the electrodes 13a and 13b for connecting to the resonators are bonded to the outer conductors 3a and 3b of the resonators 1a and 1b with this electrically conductive adhesive, and the lead electrodes 12a and 12b are electrically connected to the input and output electrodes 2a and 2b of the resonators 1a and 1b.

Figure 4:
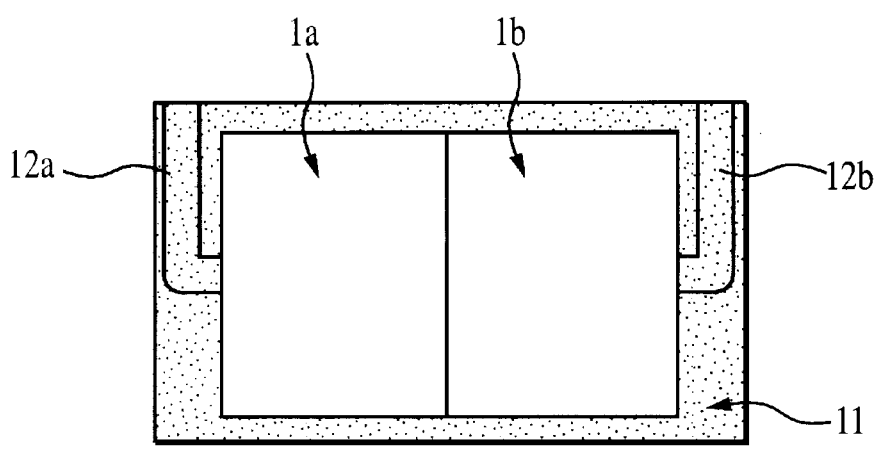
FIG. 4 is a plan view of a modification of the dielectric filter shown in FIG. 1.
Figure 5:
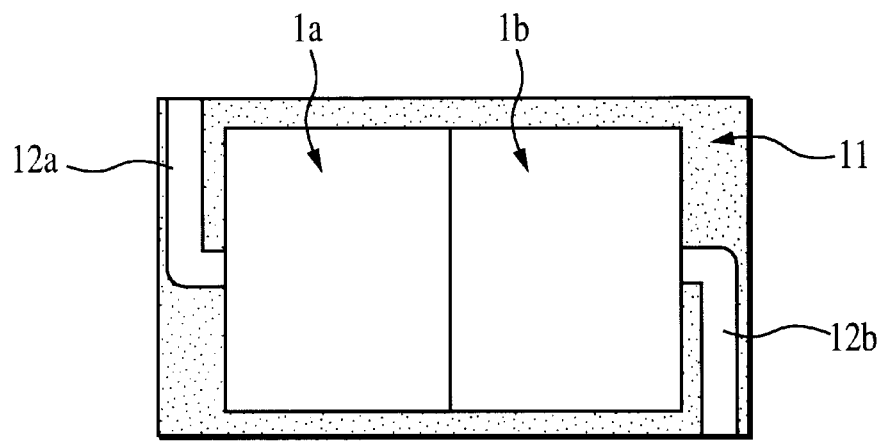
FIG. 5 is a plan view of another modification of the dielectric filter shown in FIG. 1.

In the dielectric filter 21 configured as described above, since the lead electrodes 12a and 12b are provided for the substrate 11, the lead electrodes 12a and 12b can be routed in any way on the surface of the substrate 11. In the case of the dielectric filter 21, the lead electrodes 12a and 12b are drawn to the outer peripheral portion of the substrate 11, that is, to the edges of the substrate 11, which protrude from the resonators 1a and 1b. Therefore, there are no restrictions on the directions and positions of the lead electrodes 12a and 12b. The lead electrodes 12a and 12b can be connected to an external circuit at any position. For example, the lead electrodes 12a and 12b may be drawn to both ends of a side of the substrate 11 as shown in FIG. 4, instead of being drawn to the centers of the left and right sides of the substrate 11. Alternatively, as shown in FIG. 5, the lead electrodes 12a and 12b may be drawn to two sides of the substrate 11 so that the lead directions of the lead electrodes 12a and 12b are opposite.

Since the resonators 1a and 1b are secured to the substrate 11 while being connected, bonding between the resonators 1a and 1b is reinforced by the mechanically strong substrate 11 in addition to the bonding force of the electrically conductive adhesive applied between the resonators 1a and 1b. As a result, the dielectric filter 21 having a high mutual bonding strength between the resonators 1a and 1b against bending stress is obtained.

Figure 6:
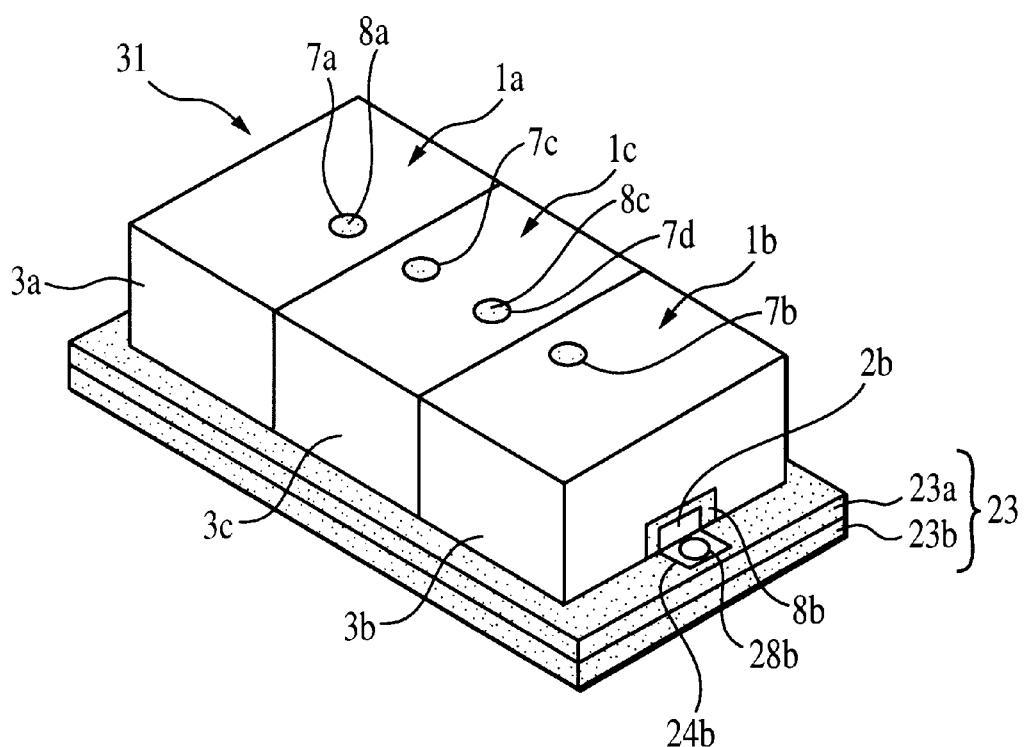
FIG. 6 is an external perspective view of a dielectric filter according to a second embodiment of the present invention.
Figure 7:
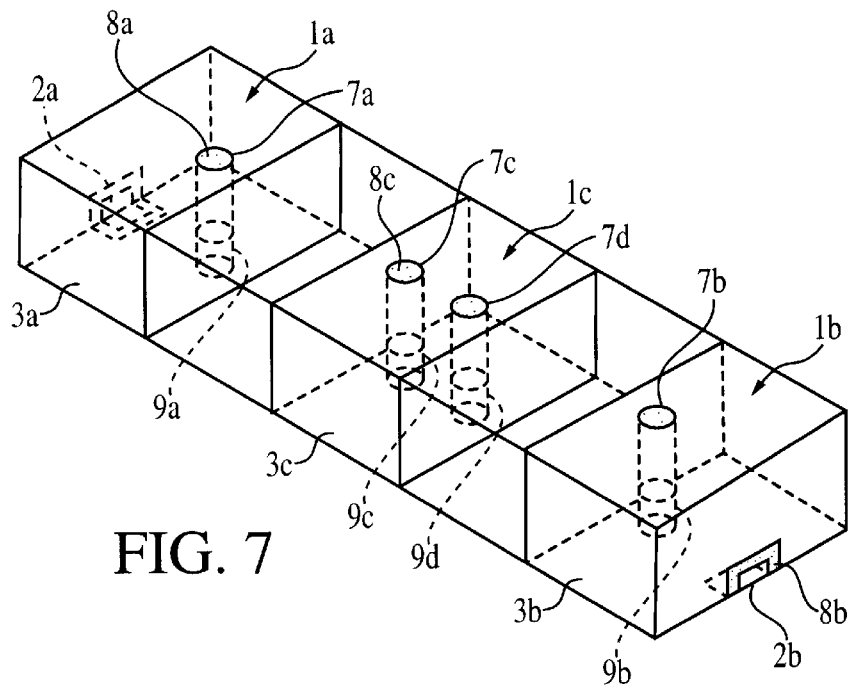
FIG. 7 is a perspective view of connected resonators used in the dielectric filter shown in FIG. 6.
Figure 8:
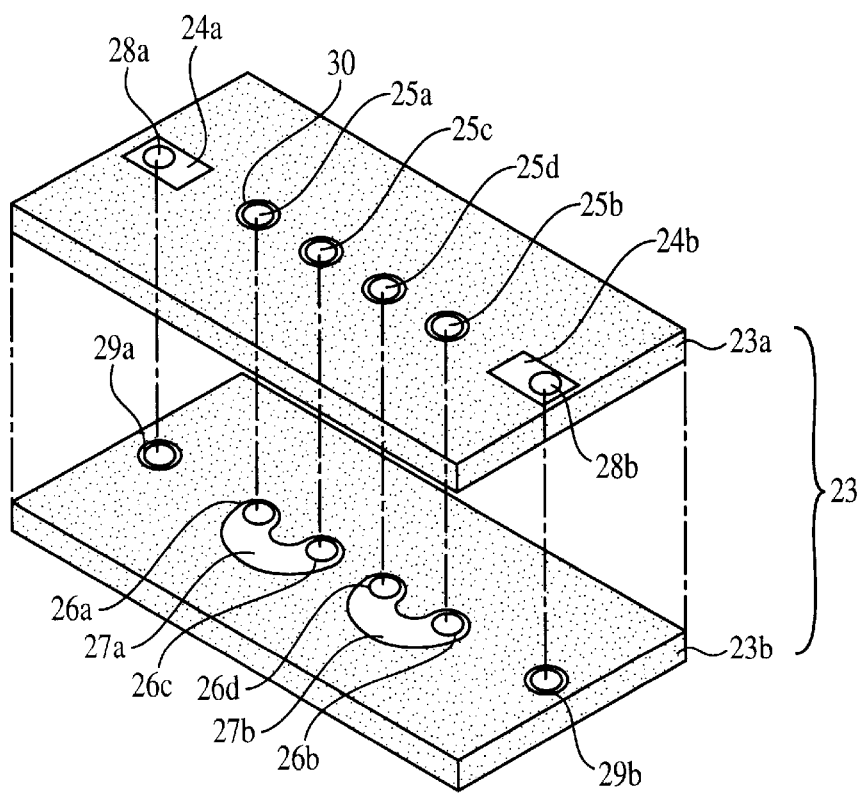
FIG. 8 is an exploded perspective view of the multilayer substrate used in the dielectric filter shown in FIG. 6.

[Second embodiment, FIG. 6 to FIG. 8]

As shown in FIG. 6, a dielectric filter 31 has three rectangular-parallelepiped $TE_{10}$-mode dielectric resonators 1a, 1b, and 1c, and an insulating multilayer substrate 23. In the three resonators 1a, 1b, and 1c, as shown in FIG. 7, outer conductors 3a, 3b, and 3c are formed on the surfaces of dielectric blocks 8a, 8b, and 8c so as to substantially cover the dielectric blocks 8a, 8b, and 8c. At ends of the resonators 1a and 1b, input and output electrodes 2a and 2b are formed.

The resonators 1a to 1c are also provided with coupling holes 7a, 7b, 7c, and 7d for mutual electromagnetic coupling. The coupling holes 7a to 7d pass through the resonators 1a to 1c in the vertical direction. At the lower portions on the inner surfaces of the coupling holes 7a, 7b, 7c, and 7d, inner conductors 9a, 9b, 9c, and 9d are provided. Except for the areas where the inner conductors 9a to 9d are provided, the dielectric blocks 8a to 8c are exposed on the inner surfaces of the coupling holes 7a to 7d.

The resonators 1a to 1c are connected in series by bonding the outer conductors 3a to 3c extending to the connection planes, with electrically conductive adhesive such as solder. As shown in FIG. 8, the multilayer substrate 23 is formed of two laminated insulating sheets 23a and 23b. At the center of the insulating sheet 23a laminated at the upper side, coupling through holes 25a to 25d are disposed in line at a specified interval. At both ends of the insulating sheet 23a, lead electrodes 24a and 24b, and lead through holes 28a and 28b connected to the lead electrodes 24a and 24b are provided.

At the center of the insulating sheet 23b laminated at the lower side, coupling through holes 26a, 26b, 26c, and 26d are provided. At both ends of the insulating sheet 23b, lead through holes 29a and 29b are provided. On the upper surface of the insulating sheet 23b, a coupling line 27a for electrically coupling the coupling through holes 26a and 26c and a coupling line 27b for electrically coupling the coupling through holes 26b and 26d are provided. On the lower surface of the insulating sheet 23b, a ground electrode (not shown) is provided without being connected to the through holes 26a to 26d, 29a, and 29b.

When the insulating sheets 23a and 23b are laminated to form the multilayer substrate 23, the coupling though holes 25a and 26a, the coupling through holes 25b and 26b, the coupling through holes 25c and 26c, the coupling holes 25d and 26d, the lead through holes 28a and 29a, and the lead through holes 28b and 29b are electrically connected while being mechanically connected. Therefore, the tips of the lead electrodes 24a and 24b are led to the rear surface of the multilayer substrate 23 through the lead through holes 28a and 29a and the lead through holes 28b and 29b, respectively.

As shown in FIG. 6, the connected resonators 1a to 1c are secured to the multilayer substrate 23. Electrically conductive adhesive is applied to the pads 30 (see FIG. 8) of the coupling through holes 25a to 25d and the lead electrodes 24a and 24b, and with this electrically conductive adhesive the coupling through hole 25a and the outer conductor 3a of the resonator 1a, and the lead electrode 24a and the input and output electrode 2a of the resonator 1a are bonded. In the same way, the coupling through hole 25b and the outer conductor 3b of the resonator 1b, the lead electrode 24b and the input and output electrode 2b of the resonator 1b, and the coupling through holes 25c and 25d and the outer conductor 3c of the resonator 1c are bonded with the electrically conductive adhesive. In this case, the coupling through holes 25a and 26a and the coupling hole 7a, the coupling through holes 25b and 26b and the coupling hole 7b, the coupling through holes 25c and 26c and the coupling hole 7c, and the coupling through holes 25d and 26d and the coupling hole 7d are mechanically connected. The resonators 1a to 1c may be secured to the substrate 23 such that conductive pins are soldered to the resonators 1a to 1c with the pins inserted into the coupling holes 7a to 7d from the lower openings so that the tips of the conductive pins protrude from the bottom surfaces of the resonators 1a to 1c, and the tips of the conductive pins are inserted into the through holes 25a and 26a, etc. and soldered.

As described above, the resonators 1a and 1c are electromagnetically coupled through the coupling hole 7a, the coupling through holes 25a and 26a, the coupling line 27a, the coupling through holes 26c and 25c, and the coupling hole 7c. In the same way, the resonators 1b and 1c are electromagnetically coupled through the coupling hole 7b, the coupling through holes 25b and 26b, the coupling line 27b, the coupling through holes 26d and 25d, and the coupling hole 7d.

The length of the conductor line from the inner conductor 9a of the coupling hole 7a through the coupling line 27a to the inner conductor 9c of the coupling hole 7c is set to an odd-number multiple of $\lambda/4$ where $\lambda$ is the central wavelength of the resonators 1a to 1c. In the same way, the length of the conductor line from the inner conductor 9b of the coupling hole 7b through the coupling line 27b to the inner conductor 9d of the coupling hole 7d is also set to an odd-number multiple of $\lambda/4$. Mutual coupling between the resonators 1a and 1c can be set to the desired value by adjusting the ratio of the total length of the conductor line from the inner conductor 9a to the coupling through hole 26a and the conductor line from the inner conductor 9c to the coupling though hole 26c to the length of the coupling line 27a.

The dielectric filter 31 configured as described above achieves the same operations and advantages as the dielectric filter 1 in the first embodiment. In addition, since the tips of the lead electrodes 28a and 28b are led to the rear surface of the multilayer substrate 23 through the lead through holes 28a and 29a and the lead through holes 28b and 29b, respectively, it becomes unnecessary for the lead electrodes 24a and 24b to be routed to an end face of the multilayer substrate 23 to reach the rear surface. Furthermore, the degree of freedom in designing the directions and positions of the lead electrodes 24a and 24b is increased.

Figure 9:
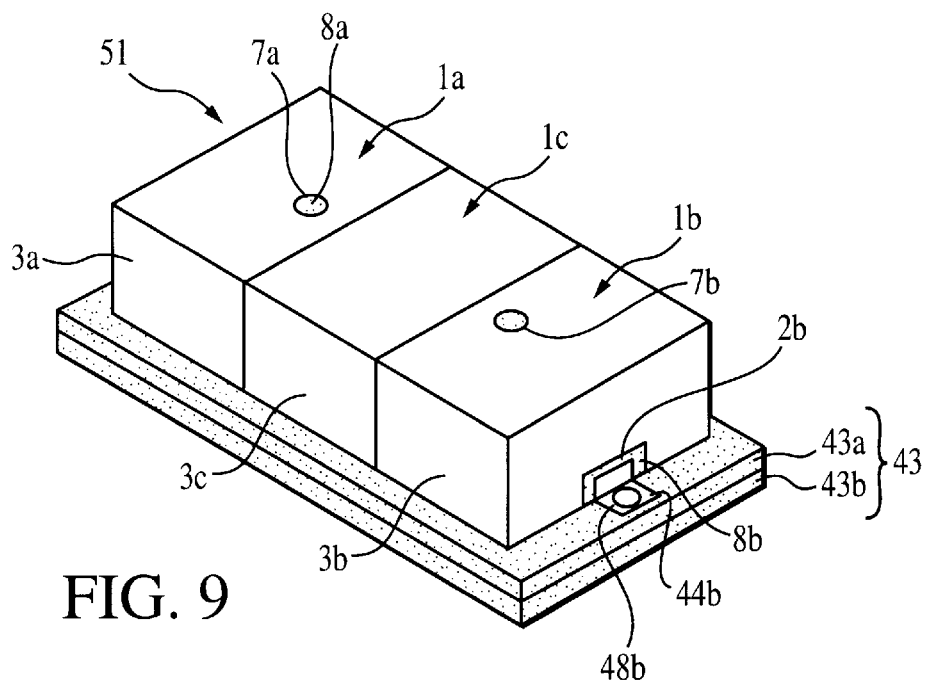
FIG. 9 is an external perspective view of a dielectric filter according to a third embodiment of the present invention.
Figure 10:
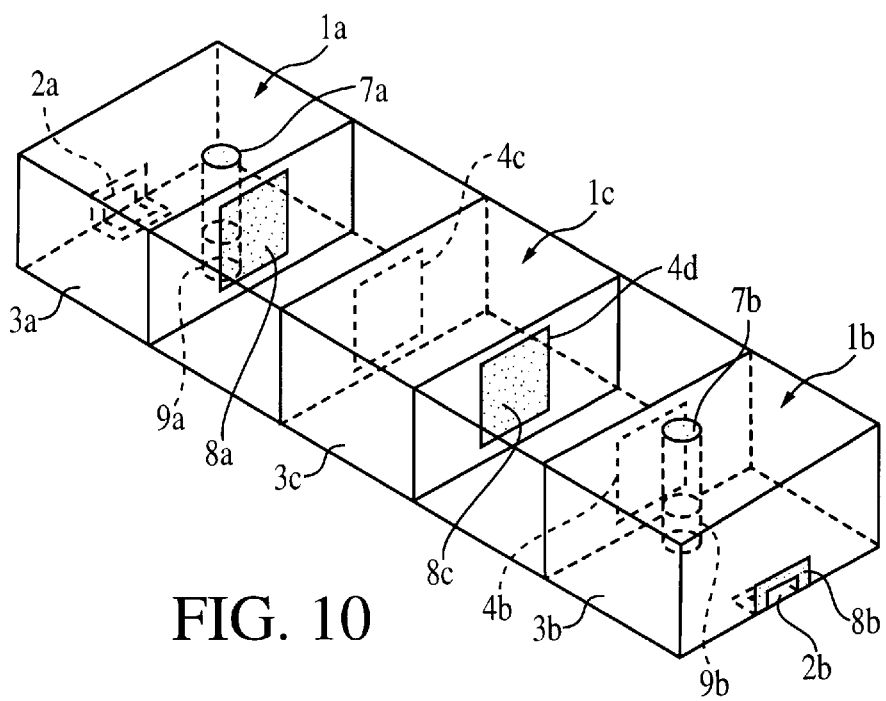
FIG. 10 is a perspective view of connected resonators used in the dielectric filter shown in FIG. 9.
Figure 11:
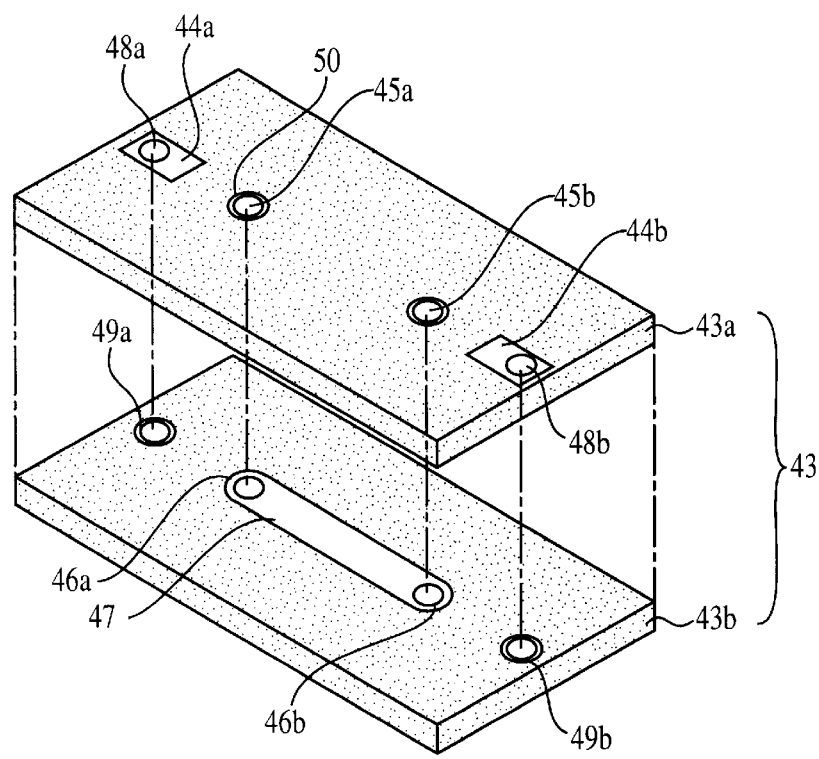
FIG. 11 is an exploded perspective view of the multilayer substrate used in the dielectric filter shown in FIG. 9.

[Third embodiment, FIG. 9 to FIG. 11]

As shown in FIG. 9, a dielectric filter 51 has three $TE_{10}$-mode dielectric resonators 1a to 1c and an insulating multilayer substrate 43. In the three resonators 1a to 1c, as shown in FIG. 10, outer conductors 3a to 3c are formed on the surfaces of dielectric blocks 8a to 8c. The resonators 1a and 1b are provided with input and output electrodes 2a and 2b and coupling holes 7a and 7b. At the lower portions on the inner surfaces of the coupling holes 7a and 7b, inner conductors 9a and 9b are provided. On the connection planes of the resonators 1a to 1c, the outer conductors 3a to 3c extend, except for coupling windows 4a to 4d. The resonators 1a to 1c are connected in series by bonding the outer conductors 3a and 3c and the outer conductors 3b and 3c extending to the connection planes, with electrically conductive adhesive.

As shown in FIG. 11, the multilayer substrate 43 is formed of two laminated insulating sheets 43a and 43b. Near the center of the insulating sheet 43a, coupling through holes 45a and 45b are provided. At both ends of the insulating sheet 43a, lead electrodes 44a and 44b, and lead through holes 48a and 48b connected to the lead electrodes 44a and 44b are provided. Near the center of the insulating sheet 43b, coupling through holes 46a and 46b are provided. At both ends of the insulating sheet 43b, lead through holes 49a and 49b are provided. On the upper surface of the insulating sheet 43b, a coupling line 47 for electrically coupling the coupling through holes 46a and 46b is provided. On the lower surface of the insulating sheet 43b, a ground electrode (not shown) is provided without being connected to the through holes 46a, 46b, 49a, and 49b. When the insulating sheets 43a and 43b are laminated, the coupling though holes 45a and 46a, the coupling through holes 45b and 46b, the lead through holes 48a and 49a, and the lead through holes 48b and 49b are electrically and mechanically connected.

As shown in FIG. 9, the connected resonators 1a to 1c are secured to the multilayer substrate 43. With electrically conductive adhesive applied to the pads 50 (see FIG. 11) of the coupling through holes 45a and 45b and the lead electrodes 44a and 44b, the coupling through hole 45a and the outer conductor 3a of the resonator 1a, the lead electrode 44a and the input and output electrode 2a of the resonator 1a, the coupling through hole 45b and the outer conductor 3b of the resonator 1b, and the lead electrode 44b and the input and output electrode 2b of the resonator 1b are bonded. In this case, the coupling through holes 45a and 46a and the coupling hole 7a, and the coupling through holes 45b and 46b and the coupling hole 7b are mechanically connected. As described above, the resonators 1a and 1c are electromagnetically coupled through the coupling windows 4a and 4c, the resonators 1b and 1c are electromagnetically coupled through the coupling windows 4b and 4d, and the resonators 1a and 1b are electromagnetically coupled through the coupling hole 7a, the coupling through holes 45b and 46a, the coupling line 47, the coupling through holes 46b and 45b, and the coupling hole 7b.

The dielectric filter 51 configured as described above achieves the same operations and advantages as the dielectric filter 31 in the second embodiment. In addition, since the first-stage resonator 1a is coupled with the third-stage resonator 1c with the use of the coupling line 47, the dielectric filter 51 having a frequency characteristic in which a pole is provided at the higher-frequency side (or lower-frequency side) of the center frequency is obtained. Therefore, the pass band of the dielectric filter is widened.

Figure 12:
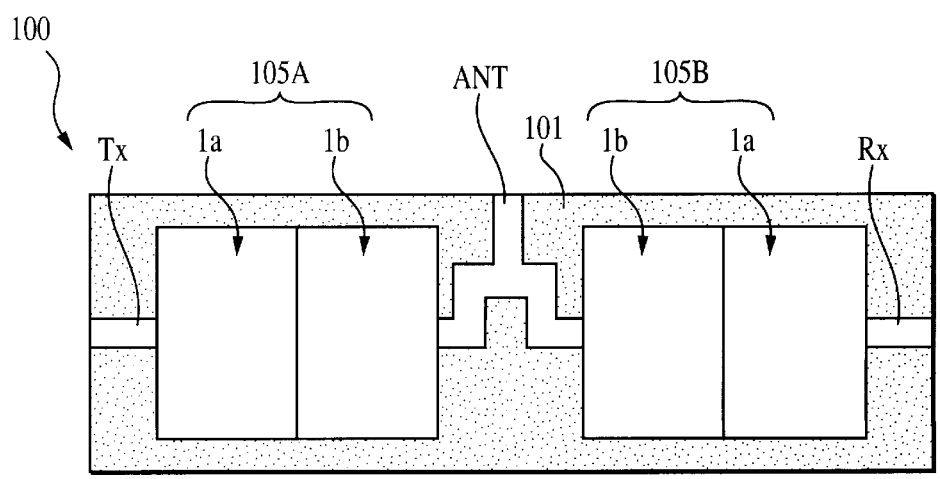
FIG. 12 is a plan view of a dielectric duplexer according to an embodiment of the present invention.
Figure 13:
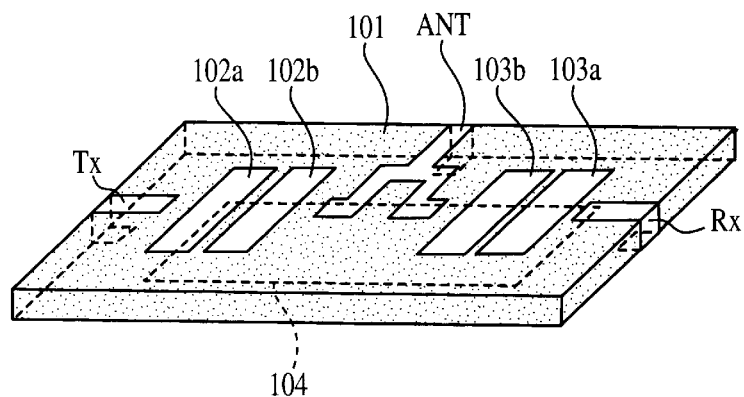
FIG. 13 is a perspective view of a substrate used in the dielectric duplexer shown in FIG. 12.

[Fourth embodiment, FIG. 12 and FIG. 13]

In a fourth embodiment, a dielectric duplexer used in a mobile communication unit such as a portable phone will be described. As shown in FIG. 12, a dielectric duplexer 100 has four rectangular-parallelepiped $TE_{10}$-mode dielectric resonators 1a and 1b, and an insulating substrate 101. Since the dielectric resonators 1a and 1b are the same as those described in the first embodiment, detailed descriptions thereof will be omitted.

As shown in FIG. 13, the insulating substrate 101 is provided on its surface with a transmission electrode Tx and a receiving electrode Rx serving as input and output electrodes, an antenna electrode ANT, electrodes 102a, 102b, 103a, and 103b for connecting resonators, and a ground electrode 104. The transmission electrode Tx and the receiving electrode Rx are formed such that first ends are disposed at specified positions so as to connect to the input and output electrodes 2a of the dielectric resonators 1a and the other ends are drawn to the center of the left-hand and right-hand sides of the substrate 101. The antenna electrode ANT is formed such that one end branches off into two parts and they are disposed at specified positions so as to connect to the input and output electrodes 2b of the dielectric resonators 1b, respectively, and the other end is drawn to the center of the far side of the substrate 101.

The electrodes 102a and 102b for connecting resonators are disposed at left-hand positions on the upper surface of the substrate 101 without being electrically connected to the transmission electrode Tx and the antenna electrode ANT. The electrodes 103a and 103b for connecting resonators are disposed at right-hand positions on the upper surface of the substrate 101 without being electrically connected to the receiving electrode Rx and the antenna electrode ANT. The ground electrode 104 is disposed on the lower surface of the substrate 101 without being electrically connected to the transmission electrode Tx, the receiving electrode Rx, and the antenna electrode ANT.

On the substrate 101, as shown in FIG. 12, the connected resonators 1a and 1b are secured. Electrically conductive adhesive is applied to the electrodes 102a to 103b for connecting resonators, the transmission electrode Tx, the receiving electrode Rx, and the antenna electrode ANT, the electrodes 102a to 103b for connecting resonators are bonded to the outer conductors 3a and 3b of the resonators 1a and 1b with this electrically conductive adhesive, and the transmission electrode Tx, the receiving electrode Rx, and the antenna electrode ANT are electrically connected to the input and output electrodes 2a and 2b of the resonators 1a and 1b.

In the dielectric duplexer 100 configured as described above, the resonators 1a and 1b disposed at the left-hand side of the substrate 101 form a transmission filter (bandpass filter) 105A. The resonators 1a and 1b disposed at the right-hand side of the substrate 101 form a receiving filter (bandpass filter) 105B. The dielectric duplexer 100 outputs from the antenna electrode ANT through the transmission filter 105A a transmission signal input to the transmission electrode Tx from a transmission circuit system not shown, and also outputs to a receiving circuit system not shown from the receiving electrode Rx through the receiving filter 105B a receiving signal input to the antenna electrode ANT.

Since the transmission electrode TX, the receiving electrode RX, and the antenna electrode ANT are provided for the substrate 101 in the dielectric duplexer 100, the transmission electrode Tx, the receiving electrode Rx, and the antenna electrode ANT can be routed and disposed in any way on the surface of the substrate 101. Therefore, there is no restrictions on the lead directions and the lead positions of the transmission electrode Tx, the receiving electrode Rx, and the antenna electrode ANT. The transmission electrode Tx, the receiving electrode Rx, and the antenna electrode ANT can be connected to external circuits at any positions.

Furthermore, since the resonators 1a and 1b are connected and secured to the substrate 101, the mutual bonding strength of the resonators 1a and 1b is reinforced by the substrate 101, which has a high mechanical strength, in addition to the adhesive force of the electrically conductive adhesive disposed between the resonators 1a and 1b. As a result, the dielectric duplexer 100 having a high mutual bonding strength of the resonators 1a and 1b against bending stress is obtained.

[Other embodiments]

A dielectric filter or a dielectric duplexer according to the present invention is not limited to those of the above embodiments. It can be changed in various ways within the scope of the present invention.

Figure 14:
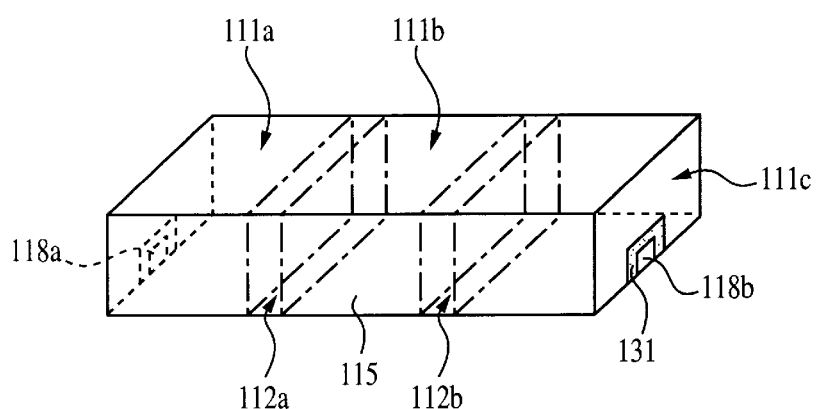
FIG. 14 is a perspective view of a dielectric filter according to another embodiment of the present invention.

In terms of bonding a plurality of TE-mode dielectric resonators, for example, as shown in FIG. 14, resonators 111a, 111b, and 111c may be bonded in series through dielectric coupling window members 112a and 112b. Since the dielectric coupling window members 112a and 112b are made from a dielectric material having a different dielectric constant from that of the material used for the resonators 111a to 111c, the window members are not only electrically coupled with the resonators 111a to 111c but also serve as electromagnetic boundaries having a high reflection coefficient between the resonators 111a to 111c.

Figure 15:
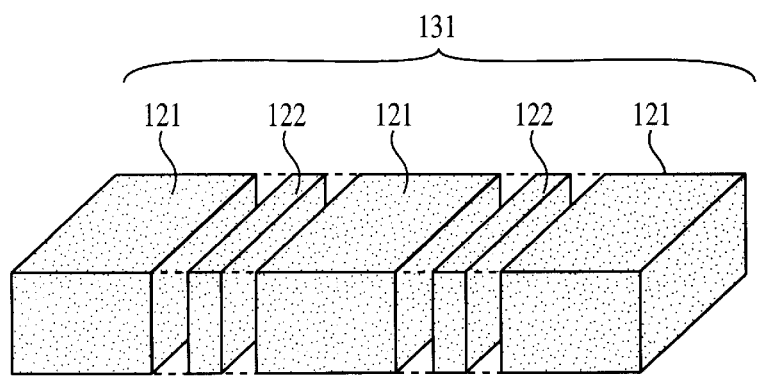
FIG. 15 is an exploded perspective view of the dielectric blocks shown in FIG. 14.

The resonators 111a to 111c and the dielectric coupling window members 112a and 112b are formed as follows: As shown in FIG. 15, dielectric blocks 121 for the resonators 111a to 111c and dielectric blocks 122 for the dielectric coupling window members 112a and 112b are prepared. The dielectric blocks 121 and 122 are made from dielectric powder kneaded with a binder to make slurry, shaped, and dried. The dielectric blocks 121 and 122 have different dielectric constants. The dielectric blocks 121 and 122 are disposed in a forming metal die such that the dielectric blocks 122 sandwich the dielectric blocks 121. Heat and pressure are applied to the dielectric blocks 121 and 122 by the forming metal die. The dielectric blocks 121 and 122 are baked as a unit to form a rectangular-parallelepiped dielectric block 131. As shown in FIG. 14, an outer conductor 115 is formed on the surface of the sintered dielectric block 131 so as to cover substantially the entire surface of the dielectric block 131. At both ends of the dielectric block 131, one pair of input and output electrodes 118a and 118b not electrically connected to the outer conductor 115 with the specified clearance set from the outer conductor 115 is formed.

In the dielectric filter configured as described above, even if the shape or the dimensions of the dielectric coupling window members 112a and 112b are not changed, when the dielectric constant of the dielectric blocks 122 which form the dielectric coupling window members 112a and 112b is made different from that of the dielectric blocks 121 which form the resonators 111a to 111c, the dielectric filter has the same central frequency and a different pass-band width. Since a dielectric filter having the same central frequency and a different pass-band width can be manufactured by the use of the same forming metal die, the number of the types of forming metal dies is substantially reduced, and manufacturing cost can be reduced.

Figure 16:
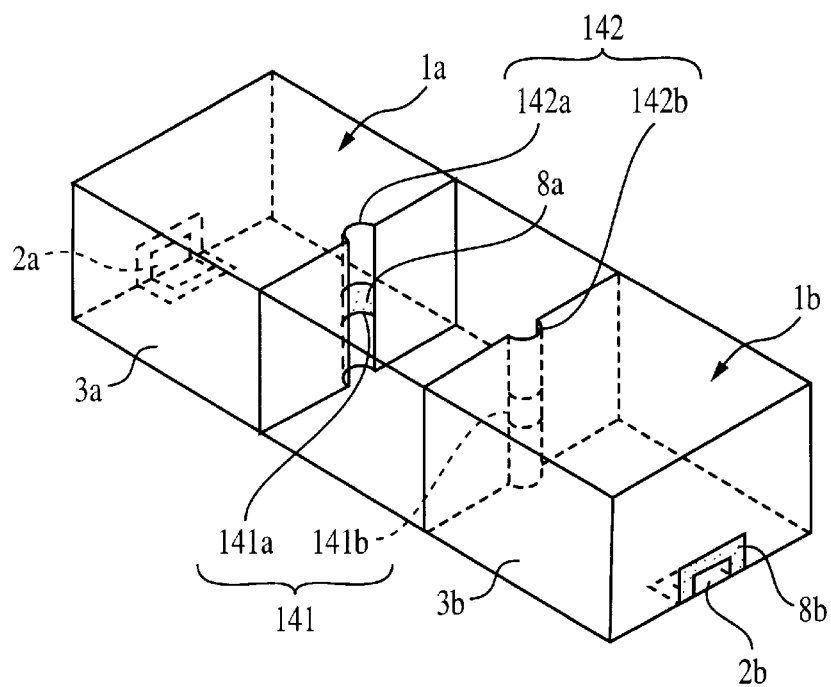
FIG. 16 is an exploded perspective view of a dielectric filter according to yet another embodiment of the present invention.

A plurality of TE-mode dielectric resonators may be bonded as shown in FIG. 16. On the connection surfaces of resonators 1a and 1b, semi-circular grooves 142a and 142b are formed from the upper to the lower surfaces of the resonators 1a and 1b. Outer conductors 3a and 3b extend to the inner surfaces of the grooves 142a and 142b except for central gaps 141a and 141b.

Figure 17:
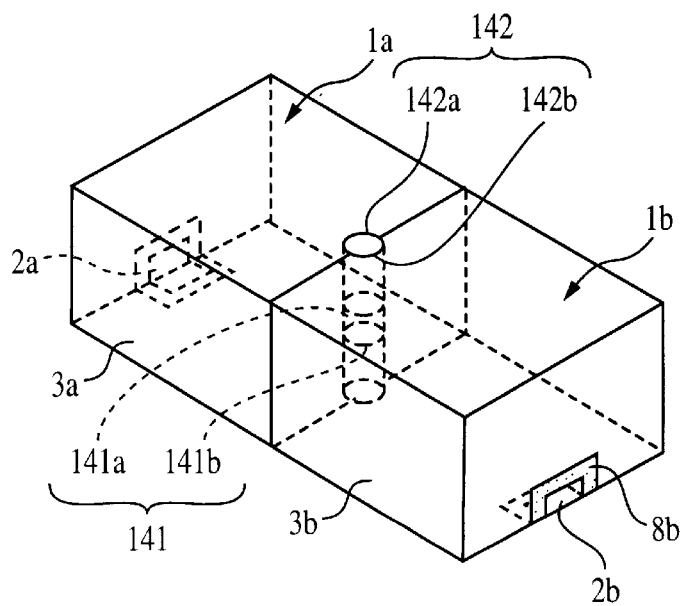
FIG. 17 is a perspective view of the dielectric filter shown in FIG. 16.
Figure 18:
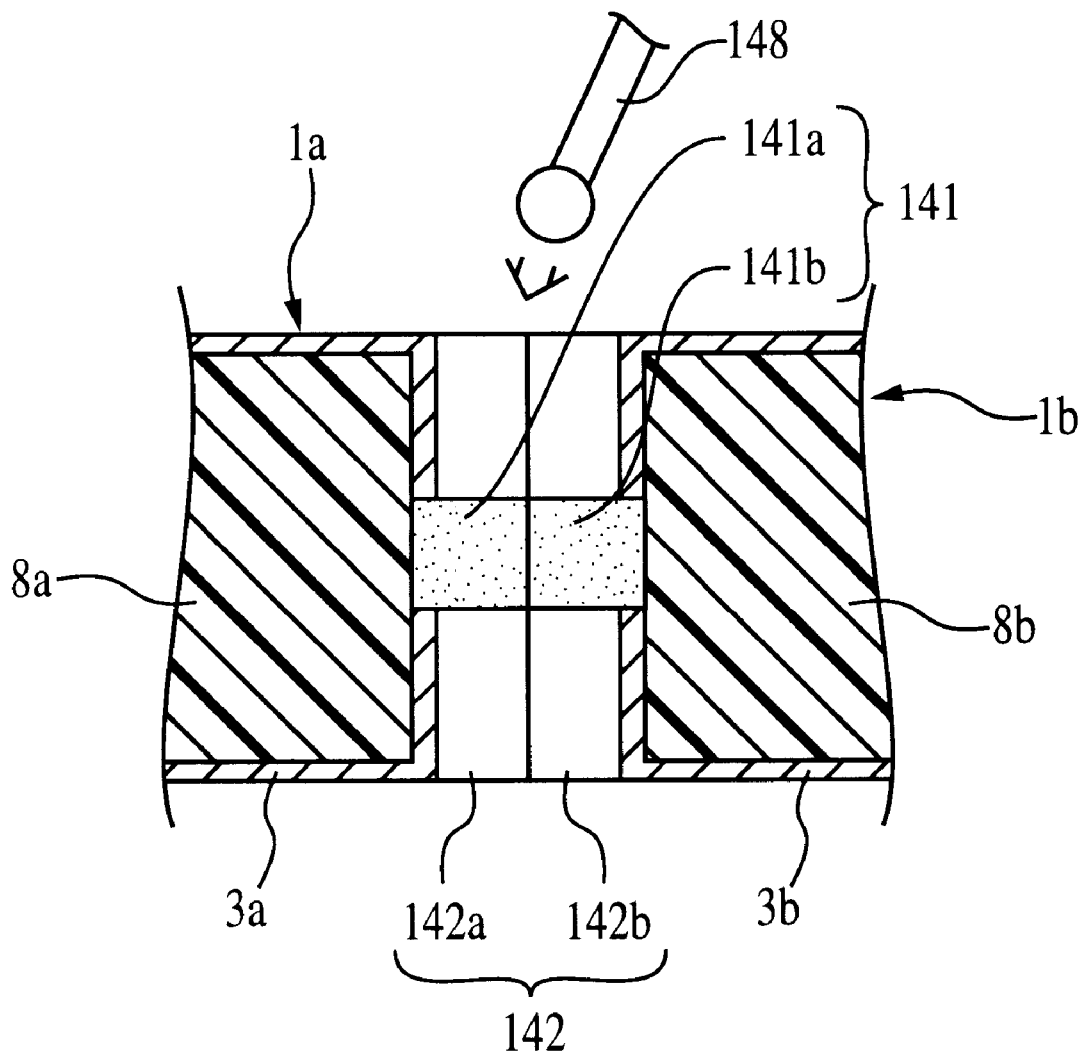
FIG. 18 is an enlarged cross section of a coupling adjustment hole in the dielectric filter shown in FIG. 17.

The connection surfaces configured as described above of the resonators 1a and 1b are bonded. As shown in FIG. 17, the grooves 142a and 142b of the resonators 1a and 1b are aligned to form a circular coupling adjustment hole 142 having an axis parallel to the connection surfaces. This coupling adjustment hole 142 passes through the dielectric filter vertically. The gaps 141a and 141b provided for the inner surfaces of the grooves 142a and 142b are also aligned to form a ring-shaped coupling window 141.

In the dielectric filter configured as described above, the resonators 1a and 1b are inductively or capacitively coupled through the coupling window 141. The characteristics (such as the amount of electromagnetic coupling between the resonators 1a and 1b and the pass-band width) of the dielectric filter are determined by the size and other factors of the coupling window 141. In the condition in which the resonators 1a and 1b are connected, the characteristics of the filter such as the pass-band width are measured, and according to the measurement results, the size and other factors of the coupling window 141 are changed. Since the coupling window 141 is exposed on the inner surface of the coupling adjustment hole 142 even with the resonators 1a and 1b being not separated, a cutting jig 148 such as a router is inserted into the coupling adjustment hole 142 from the opening of the hole 142 and the outer conductors 3a and 3b around the coupling window 141 are removed to change the size and other factors of the coupling window 141.

As described above, characteristics adjustment can be performed with the resonators 1a and 1b being connected, and adjustment work is facilitated. In addition, since it is unnecessary to disconnect and connect the resonators 1a and 1b, unstable adjustment in a conventional dielectric filter is eliminated which is caused by difficulty in connecting the resonators 1a and 1b again in the same manner. The coupling adjustment hole 142 not necessarily pass through the dielectric filter vertically. It may pass through from the near surface to the far surface of the dielectric filter, or it may have the axis at an angle against the outer wall surface of the dielectric filter. Further alternatively, the coupling adjustment hole 142 has a rectangular cross section instead of a circular cross section.

Figure 19:
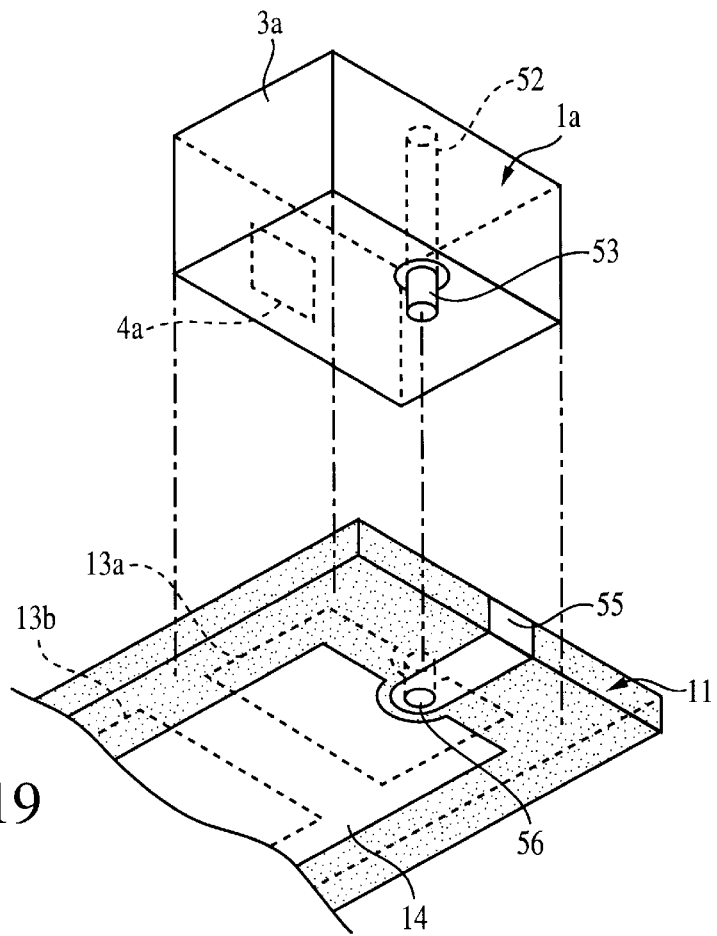
FIG. 19 is an exploded perspective bottom view of a dielectric filter according to still another embodiment of the present invention.

An input and output electrode provided for the resonators can be connected to a lead electrode provided for the substrate in any way. As shown in FIG. 19, for example, a coupling hole 52 is made in the resonator 1a and a conductive pin 53 serving as an input and output electrode is inserted into the coupling hole 52 from the lower opening and soldered. This conductive pin 53 is electrically unconnected to the outer conductor 3a and its tip protrudes from the bottom surface of the resonator 1a. On the other hand, the substrate 11 is provided with the ground electrode 14 and a lead through hole 56 electrically unconnected to the electrode 13a for connecting to a resonator. In addition, a lead electrode 55 connected to the lead through hole 56 is provided on the lower surface of the substrate 11 and is led to an end face of the substrate 11. The resonator 1a is placed on the substrate 11 such that the tip of the conductive pin 53 is inserted into the lead through hole 56, and the conductive pin 53 is soldered to the lead electrode 55.

Figure 20:
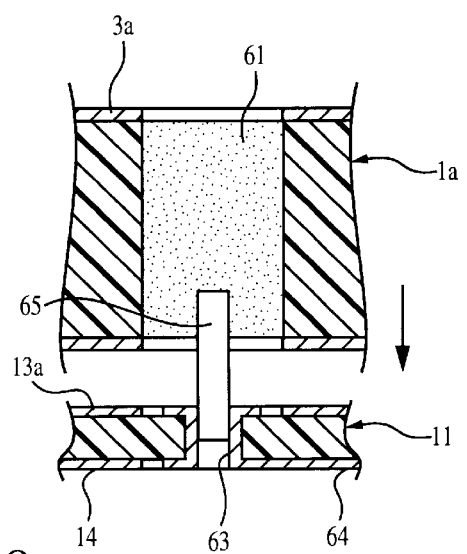
FIG. 20 is an exploded cross-sectional view of a dielectric filter according to a further embodiment of the present invention.

Alternatively, as shown in FIG. 20, a coupling hole 61 is made in the resonator 1a. On the other hand, the substrate 11 is provided with an electrode 13a for connecting to a resonator and a lead through hole 63 electrically unconnected to the ground electrode 14. In addition, a lead electrode 64 connected to the lead through hole 63 is provided on the lower surface of the substrate 11. A conductive pin 65 is inserted into the through hole 63 from the upper opening and soldered. When the resonator 1a is placed on the substrate 11 and the electrode 13a for connecting to the resonator is bonded to the outer conductor 3a of the resonator 1a with electrically conductive adhesive, the conductive pin 65 is inserted into the coupling hole 61, and the coupling hole 61 is electromagnetically coupled with the conductive pin 65.

Figure 21:
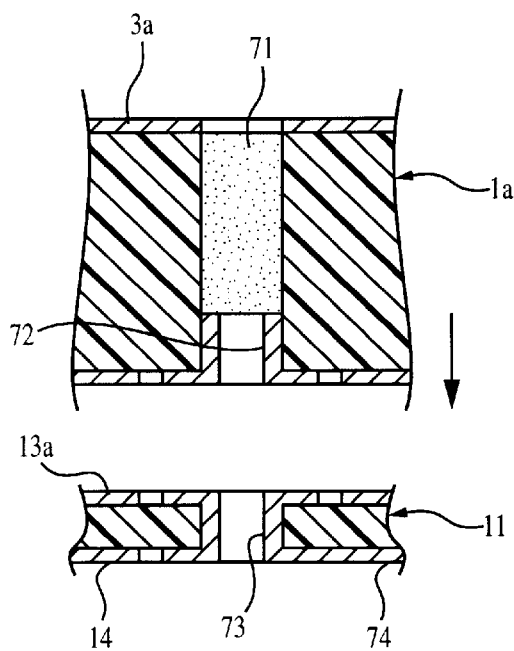
FIG. 21 is an exploded cross-sectional view of a dielectric filter according to a yet further embodiment of the present invention.
Figure 22:
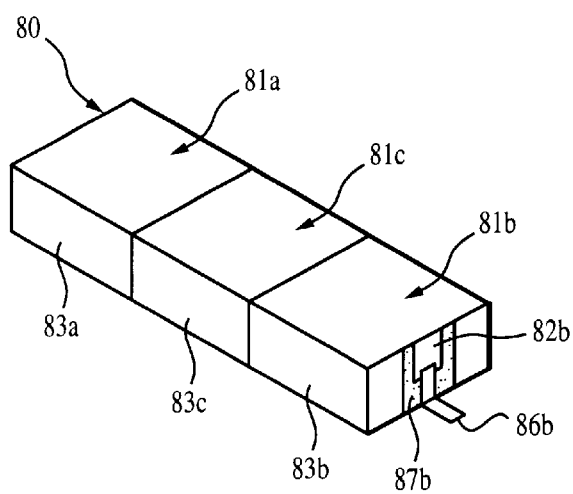
FIG. 22 is an external perspective view of a conventional dielectric filter.
Figure 23:
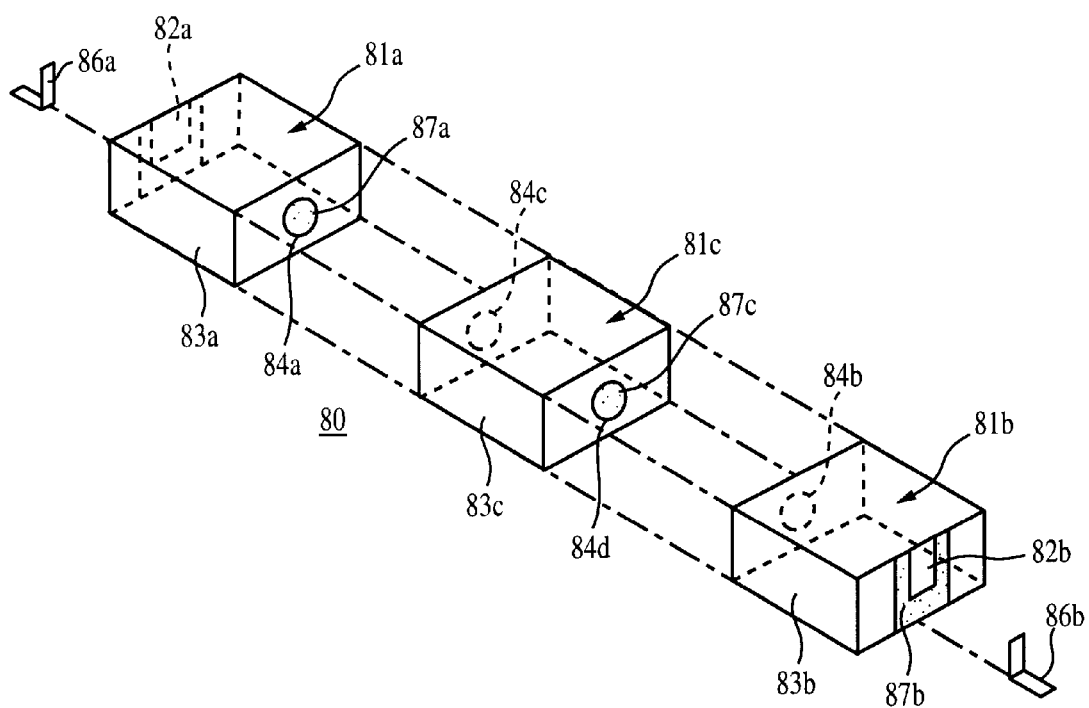
FIG. 23 is an exploded perspective view of the dielectric filter shown in FIG. 22.
Figure 24:
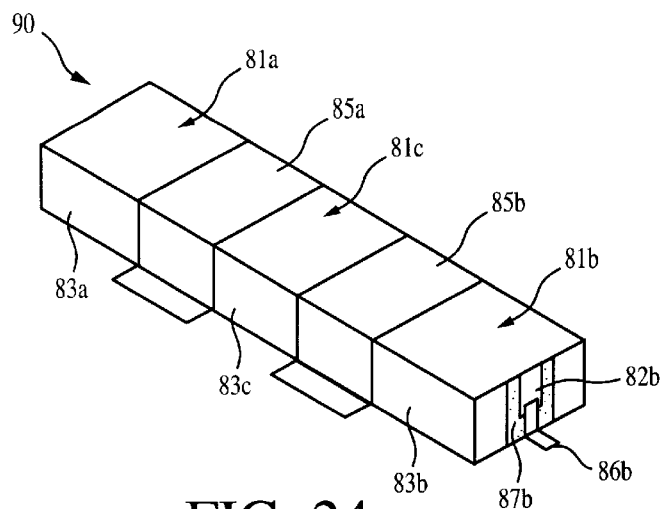
FIG. 24 is an external perspective view of another conventional dielectric filter.
Figure 25:
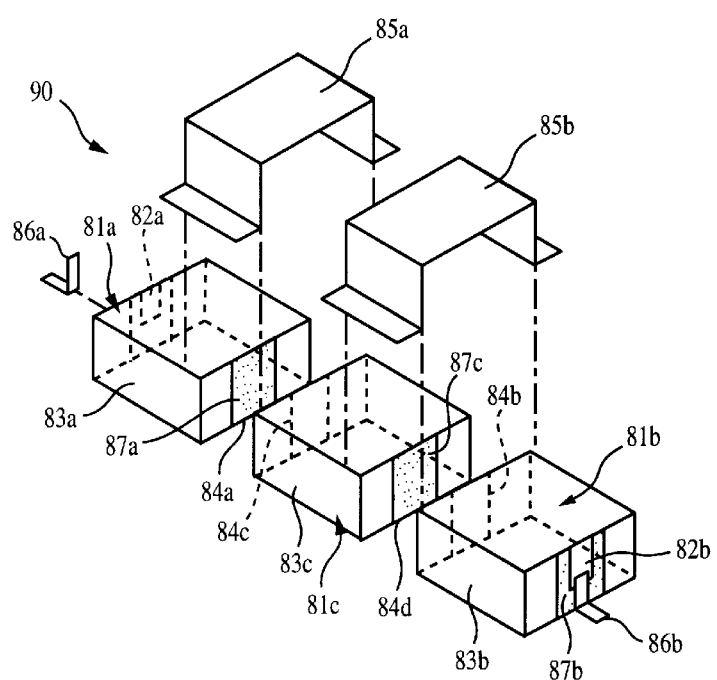
FIG. 25 is an exploded perspective view of the dielectric filter shown in FIG. 24.

Alternatively, as shown in FIG. 21, a coupling hole 71 is made in the resonator 1a. At the lower opening portion of the coupling hole 71, a flange-shaped conductor 72 serving as an input and output electrode is provided without being connected to the outer conductor 3a. On the other hand, the substrate 11 is provided with the electrode 13a for connecting to a resonator and a lead through hole 73 electrically unconnected to the ground electrode 14. In addition, a lead electrode 74 connected to the lead through hole 73 is provided on the lower surface of the substrate 11. The resonator 1a is placed on the substrate 11, the electrode 13a for connecting to a resonator is bonded to the outer conductor 3a of the resonator 1a with electrically conductive adhesive, and the flange-shaped conductor 72 is bonded to the lead through hole 73 with electrically conductive adhesive. Then, the coupling hole 71a is mechanically connected to the through hole 73, and the resonator 1a and the lead electrode 74 is electromagnetically coupled with the lead electrode 74 through the coupling hole 71 and the lead through hole 73.

Instead of the multilayer substrates 23 and 43 used in the dielectric filters 31 and 51 in the second and third embodiments, a double-sided substrate may be used. In this case, it is necessary to form a coupling line on the lower surface of the doubled-sided substrate and to connect a coupling hole of a resonator placed on the upper surface of the double-sided substrate to the coupling line through a through hole provided for the double-sided substrate.

According to the specification, in a dielectric filter or a dielectric duplexer, resonators may be mechanically connected to each other at the connection planes and soldered to a substrate, instead of being bonded to each other with electrically conductive adhesive.

In the above embodiments, the dielectric filters include two or three resonators. The number of resonators used is not limited to these cases. A dielectric filter according to the present invention may have four or more resonators.

While the invention has been particularly shown and described with reference to preferred embodiments thereof, it will be understood by those skilled man in the art that the forgoing and other changes in form and details may be made therein without departing from the spirit of the invention.

What is claimed is:

1. A dielectric filter, comprising;
   an insulating substrate;
   a plurality of TE-mode dielectric resonators including a first resonator and a last resonator, each of said resonators comprising a dielectric block, a respective conductor being provided on each dielectric block, and a respective input/output electrode being provided on a surface of said respective dielectric block of each of said first and last resonators, said TE-mode dielectric resonators being disposed on said insulating substrate and
   each said input/output electrode being electrically connected to a respective lead electrode provided on said insulating substrate;
   wherein a coupling line for coupling at least two of said plurality of TE-mode dielectric resonators is provided on said insulating substrate.

2. The dielectric filter according to claim 1, wherein said plurality of TE-mode dielectric resonators are connected in series and secured to said substrate.

3. The dielectric filter according to claim 1, wherein said substrate is a multilayer substrate formed of at least two insulating sheets laminated to each other.

4. The dielectric filter according to claim 1, wherein at least one said lead electrode is associated with a lead through hole extending to both of two major surfaces of said substrate.

5. The dielectric filter according to claim 4, wherein said substrate is a multilayer substrate formed of at least two insulating sheets laminated to each other.

6. A dielectric duplexer, comprising:
   an insulating substrate;
   a transmission filter and a receiving filter disposed on said insulating substrate;
   a transmission electrode and a receiving electrode provided on said insulating substrate and electrically connected to said transmission filter and said receiving filter, respectively;
   an antenna electrode provided on said insulating substrate and connected to both of said transmission filter and said receiving filter;
   wherein at least one of said transmission filter and said receiving filter comprises a plurality of TE-mode dielectric resonators including a first resonator and a last resonator, each of said resonators comprising a dielectric block, a respective conductor being provided on each dielectric block, and a respective input/output electrode being provided on a surface of said respective dielectric block of each of said first and last resonators, said TE-mode resonators being disposed on said insulating substrate;
   lead electrodes disposed on said insulating substrate, each said input/output electrode being electrically connected to a respective one of said lead electrodes provided on said insulating substrate; and
   a ground electrode disposed on said insulating substrate and electrically isolated from said resonators.

7. A dielectric duplexer, comprising
   an insulating substrate;
   at least one first TE-mode dielectric resonator forming a transmission filter, comprising a first dielectric block, a respective first conductor and a respective first input/output electrode provided on a surface of said first dielectric block, said first TE-mode dielectric resonator disposed on said insulating substrate;
   at least one second TE-mode dielectric resonator forming a receiving filter, comprising a second dielectric block, a respective second conductor and a respective second input/output electrode provided on a surface of said second dielectric block, said second TE-mode dielectric resonator disposed on said insulating substrate;
   a transmission electrode and a receiving electrode provided on said insulating substrate and electrically connected to said transmission filter and said receiving filter respectively; and
   an antenna electrode provided on said insulating substrate and connected to both of said transmission filter and said receiving filter;
   wherein at least one of said transmission filter and said receiving filter comprises a plurality of TE-mode dielectric resonators which are connected in series and secured to said insulating substrate; and
   wherein a coupling line for coupling at least two of said plurality of TE-mode dielectric resonators is provided on said insulating substrate.

8. The dielectric duplexer according to claim 7, wherein each said input/output electrode is electrically connected to a respective lead electrode provided on said insulating substrate; and wherein at least one said lead electrode is associated with a lead through hole extending to both of two major surfaces of said substrate.

9. The dielectric duplexer according to claim 8, wherein said substrate is a multilayer substrate formed of at least two insulating sheets laminated to each other.

10. The dielectric duplexer according to claim 7, wherein said substrate is a multilayer substrate formed of at least two insulating sheets laminated to each other.

11. A dielectric filter, comprising:

an insulating substrate;

a plurality of TE-mode dielectric resonators including a first resonator and a last resonator, each of said resonators comprising a dielectric block, a respective conductor being provided on each dielectric block, and a respective input/output electrode being provided on a surface of said respective dielectric block of each of said first and last resonators, said TE-mode resonators being disposed on said insulating substrate;

lead electrodes disposed on said insulating substrate, each said input/output electrode being electrically connected to a respective one of said lead electrodes provided on said insulating substrate; and a ground electrode disposed on said insulating substrate and electrically isolated from said resonators.

* * * * *